(12) United States Patent
Karpov et al.

(10) Patent No.: US 9,159,915 B2
(45) Date of Patent: Oct. 13, 2015

(54) PHASE CHANGE MEMORY WITH THRESHOLD SWITCH SELECT DEVICE

(71) Applicant: Ovonyx, Inc., Sterling Heights, MI (US)

(72) Inventors: Ilya V. Karpov, Santa Clara, CA (US); Sean Jong Lee, Yongin (KR); Yudong Kim, Santa Clara, CA (US); Greg Atwood, San Jose, CA (US)

(73) Assignee: Ovonyx, Inc., Sterling Heights, MI (US)

( * ) Notice: Subject to any disclaimer, the term of this patent is extended or adjusted under 35 U.S.C. 154(b) by 0 days.

(21) Appl. No.: 14/132,286

(22) Filed: Dec. 18, 2013

(65) Prior Publication Data

US 2014/0104939 A1 Apr. 17, 2014

Related U.S. Application Data

(62) Division of application No. 11/272,208, filed on Nov. 10, 2005, now Pat. No. 8,637,342.

(51) Int. Cl.
*H01L 45/00* (2006.01)
*H01L 27/24* (2006.01)
*G11C 13/00* (2006.01)

(52) U.S. Cl.
CPC .......... *H01L 45/141* (2013.01); *G11C 13/0004* (2013.01); *H01L 27/2427* (2013.01); *H01L 27/2472* (2013.01); *H01L 45/06* (2013.01); *H01L 45/126* (2013.01); *H01L 45/1233* (2013.01); *H01L 45/1683* (2013.01)

(58) Field of Classification Search
CPC ... H01L 45/141; H01L 45/06; H01L 27/2427; H01L 27/2472; G11C 13/0004
See application file for complete search history.

(56) References Cited

U.S. PATENT DOCUMENTS

2005/0180216 A1* 8/2005 Lowrey .................... 365/185.22

* cited by examiner

*Primary Examiner* — Long Pham

(57) ABSTRACT

An ovonic threshold switch may be formed of a continuous chalcogenide layer. That layer spans multiple cells, forming a phase change memory. In other words, the ovonic threshold switch may be formed of a chalcogenide layer which extends, uninterrupted, over numerous cells of a phase change memory.

14 Claims, 5 Drawing Sheets

PHASE CHANGE MEMORY WITH THRESHOLD SWITCH SELECT DEVICE

CROSS-REFERENCE TO RELATED APPLICATIONS

This application is a divisional of U.S. patent application Ser. No. 11/272,208, filed on Nov. 10, 2005.

BACKGROUND

This invention relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

In accordance with some embodiments of the present invention, a phase change memory may be made with a selection device in a way which may reduce the number of masking steps. In some embodiments, a chalcogenide layer used to form an ovonic threshold switch selection device may be provided as a blanket deposition. This avoids the need for extra etching steps to etch that chalcogenide layer to form the individual cells of a phase change memory.

Figure 1:
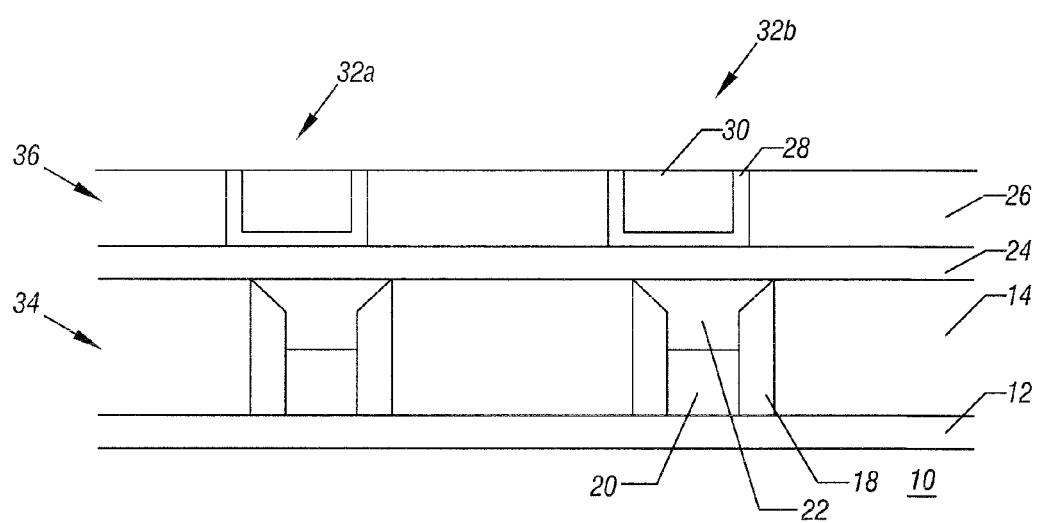
FIG. 1 is an enlarged, cross-sectional view through one embodiment of the present invention.

Referring to FIG. 1, the phase change memory may be formed over a substrate 10. The phase change memory may include an ovonic unified memory 34 defined by the layers 12 and 14 in one embodiment. The layer 12 may be an electrode, such as a row electrode, extending in a first direction. The layer 14 may be an insulating layer, such as an oxide layer, with pores formed therein to define the cells of the ovonic unified memory 34. The ovonic unified memory or memory element 34 may also include a sidewall spacer 18, in some embodiments, which is defined around a heater 20. The heater 20 is electrically coupled to the layer 12. Over the heater 20 may be situated a phase change material 22.

The selection device 36, which may be an ovonic threshold switch, includes a layer 24 of chalcogenide material such as $Ge_6Si_{20}As_{32}Te_{36}$. The layer 24 may be blanket deposited, thereby reducing the need for etching. Over the layer 24 may be an insulating layer 26, such as oxide, having pores defined therein. The pores may be filled with a layer 28 and a layer 30 which may then both be planarized. The layer 30 may be an upper electrode which extends in a second direction transverse to the first direction. The layer 28, in one embodiment, may be a barrier layer to isolate an upper electrode 30, which may be formed of copper in some embodiments, from the rest of the structure. Suitable copper barrier layer 28 materials include the following: titanium nitride, tantalum nitride, and ruthenium oxide.

Figure 2:
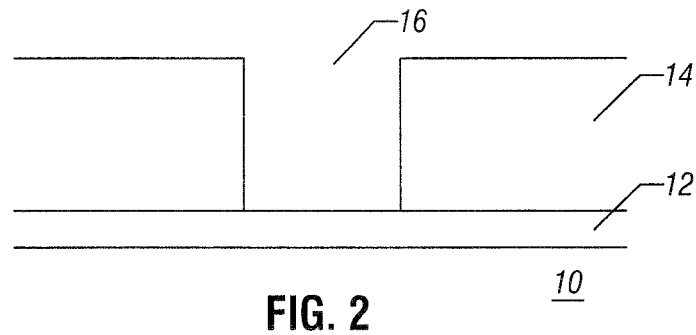
FIG. 2 is an enlarged, cross-sectional view at an early stage of manufacture in accordance with one embodiment.

The fabrication of the structure shown in FIG. 1 may proceed, in some embodiments, according to FIGS. 2-10. Initially, a damascene row electrode may be used as the layer 12, defined over a substrate 10, as shown in FIG. 2. The substrate 10 may be a semiconductor substrate or interlayer dielectric, as two examples. Over the layer 12, which may be a row line, may be situated an insulator 14, such as oxide. A pore 16 may be defined in the insulator 14.

Figure 3:
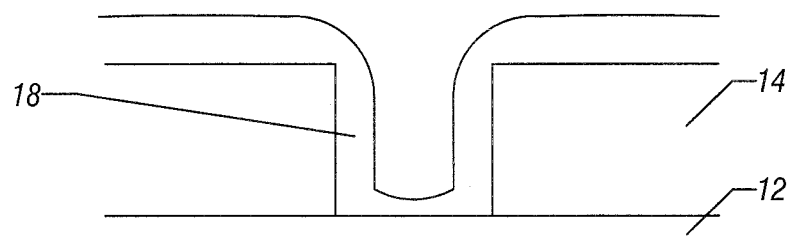
FIG. 3 is an enlarged, cross-sectional view at a subsequent stage in accordance with one embodiment.
Figure 4:
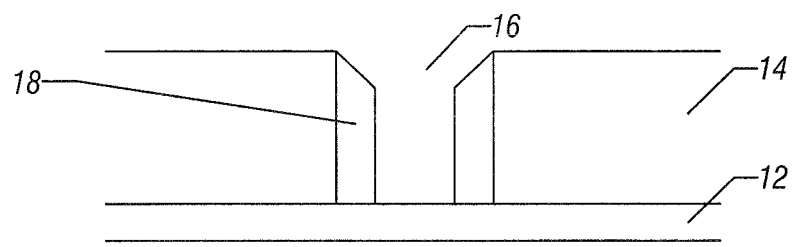
FIG. 4 is an enlarged, cross-sectional view at a subsequent stage in accordance with one embodiment.

As shown in FIG. 3, a suitable insulating material is then deposited over the insulator 14 and into the pore 16 in one embodiment. Then, the insulating material may be anisotropically etched to form a sidewall spacer 18. For example, the sidewall spacers 18 may be formed of a nitride material. However, other materials may also be utilized. As a result of the anisotropic etching, the horizontal portions of the sidewall spacer 18 and its uppermost extent of the vertical portions may be removed, leaving the structure shown in FIG. 4.

Figure 5:
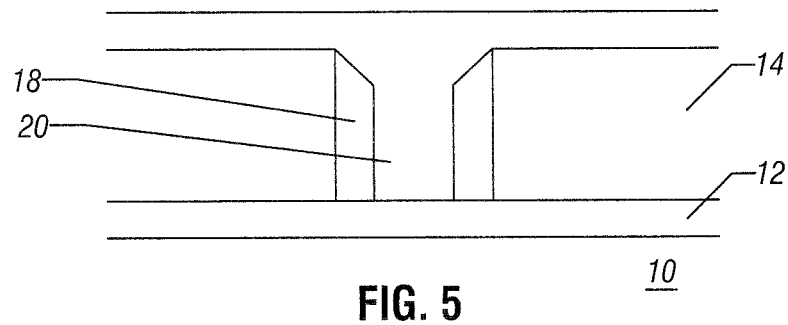
FIG. 5 is an enlarged, cross-sectional view at a subsequent stage in accordance with one embodiment.
Figure 6:
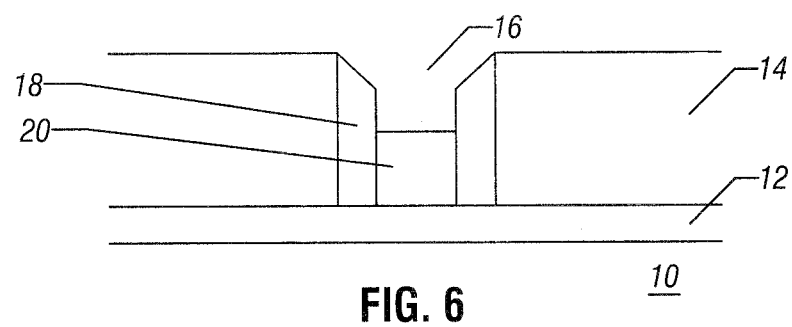
FIG. 6 is an enlarged, cross-sectional view at a subsequent stage in accordance with one embodiment.

Next, the heater 20 may be deposited as shown in FIG. 5. In some embodiments, the heater 20 may be formed of titanium silicon nitride. Then, a recess etch may be utilized to redefine the pore 16 over the remaining portion of the heater 20 as shown in FIG. 6. In some embodiments, a dip back process may be utilized. However, in other embodiments, the recess may be formed by dry or wet etching.

Figure 7:
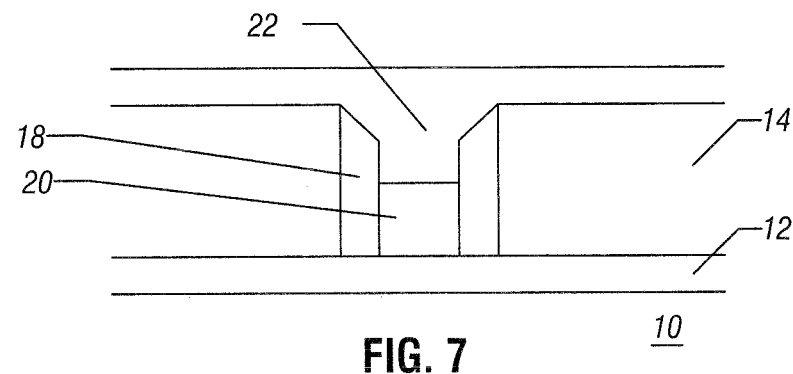
FIG. 7 is an enlarged, cross-sectional view at a subsequent stage in accordance with one embodiment.
Figure 8:
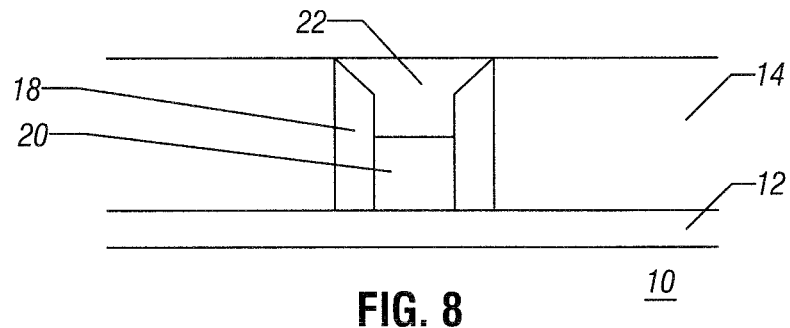
FIG. 8 is an enlarged, cross-sectional view at a subsequent stage in accordance with one embodiment.

Then, as shown in FIG. 7, a chalcogenide layer 22 may be deposited in the pore 16 and over the layer 14. The chalcogenide layer 22 may be formed of any chalcogenide which changes phase, resulting in the structure shown in FIG. 7. The chalcogenide layer 22 may then be planarized, as shown in FIG. 8, down to the level of the layer 14 so that only the portion within the pore 16 remains.

Figure 9:
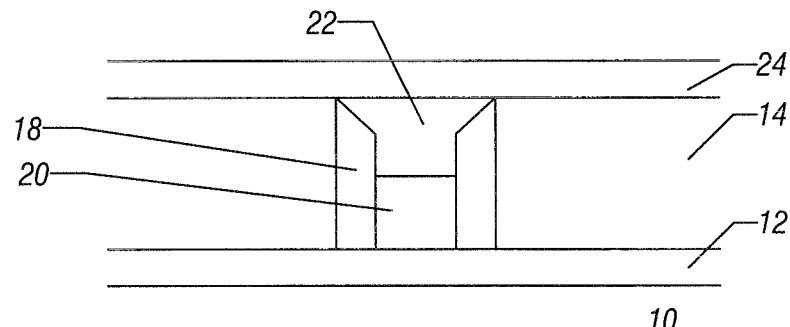
FIG. 9 is an enlarged, cross-sectional view at a subsequent stage in accordance with one embodiment.

Next, as shown in FIG. 9, the chalcogenide layer 24 may be blanket deposited. The chalcogenide layer 24 may be used for the selection device 36, forming an ovonic threshold switch that generally does not change phase during normal operation.

Figure 10:
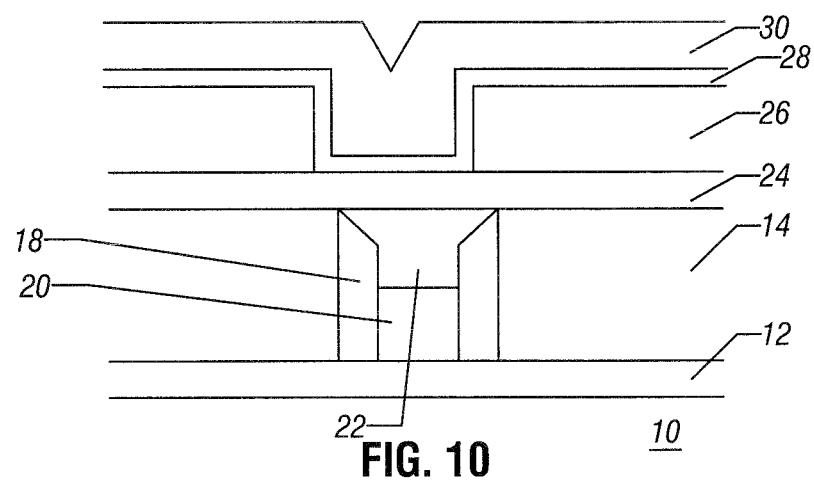
FIG. 10 is an enlarged, cross-sectional view at a subsequent stage in accordance with one embodiment.

Turning to FIG. 10, another insulator 26 may be formed over the layer 24, followed by a barrier layer 28, followed by the layer 30 which forms the upper electrode. Where the upper electrode is copper, the barrier layer 28 may be a copper diffusion barrier material. That structure then may be planarized down to the level of the insulator 26 to form the structure shown in FIG. 1.

No conductive electrode is included between the layers 24 and 22, to avoid any need for patterning. The layer 24 may be insulating so no significant conduction may occur between cells.

Referring again to FIG. 1, two cells 32a and 32b are depicted from an array of phase change memory cells. Each cell 32 includes an ovonic unified memory 34 overlaid by an ovonic threshold switch selection device 36. As shown, the selection device 36 need not be self-aligned to the ovonic unified memory 34. Separating the two structures is the blanket deposited layer 24 which extends, not only across one cell 32a, but across the adjacent cell 32b, as well as all the cells (not shown) of an array of phase change memory cells. Thus, it may not be necessary to etch the layer 24, in some embodiments, so that the layer 24 forms a common, unetched, continuous layer for multiple cells including the cells 32a and 32b.

A series connected select device in the form of the ovonic threshold switch may be used to access a memory element, including the phase change material 32, during programming or reading of memory element. A select device may be an ovonic threshold switch that can be made of a chalcogenide alloy that does not exhibit an amorphous to crystalline phase change and which undergoes rapid, electric field initiated change in electrical conductivity that persists only so long as a holding voltage is present.

The selection device 36 may operate as a switch that is either "off" or "on" depending on the amount of voltage potential applied across the memory cell 32 and, more particularly, whether the current through the selection device 36 exceeds its threshold current or voltage, which then triggers the device into the on state. The off state may be a substantially electrically nonconductive state and the on state may be a substantially conductive state, with less resistance than the off state.

In the on state, the voltage across the select device 36 is equal to its holding voltage $V_H$ plus I×Ron, where Ron is the dynamic resistance from the extrapolated X-axis intercept, $V_H$. For example, a selection device 36 may have threshold voltages and, if a voltage potential less than the threshold voltage of a selection device is applied across the selection device, then the selection device may remain "off" or in a relatively high resistive state so that little or no electrical current passes through the memory cell and most of the voltage drop from selected row to selected column is across the selection device 36. Alternatively, if a voltage potential greater than the threshold voltage of a selection device 36 is applied across the selection device, then the selection device 36 may "turn on," i.e., operate in a relatively low resistive state so that electrical current passes through the memory cell. In other words, one or more series connected selection devices 36 may be in a substantially electrically nonconductive state if less than a predetermined voltage potential, e.g., the threshold voltage, is applied across selection devices. Selection devices may be in a substantially conductive state if greater than the predetermined voltage potential is applied across select devices. Selection devices may also be referred to as an access device, an isolation device, or a switch.

In one embodiment, each selection device may comprise a switching material such as, for example, a chalcogenide alloy as the layer 24, and may be referred to as an ovonic threshold switch, or simply an ovonic switch. The switching material of selection devices 36 may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with $V_H$) by application of a predetermined electrical current or voltage potential. In this embodiment, each selection device 36 may be a two terminal device that may have a current-voltage (I-V) characteristic similar to a phase change memory element that is in the amorphous state. However, unlike a phase change memory element 34, the switching material of selection devices 36 may not change phase. That is, the switching material of selection devices 36 may not be a programmable material, and, as a result, selection devices 36 may not be a memory device capable of storing information. For example, the switching material of selection devices 36 may remain permanently amorphous and the I-V characteristic may remain the same throughout the operating life.

In the low voltage or low electric field mode, i.e., where the voltage applied across selection device is less than a threshold voltage (labeled $V_{TH}$), a selection device 36 may be "off" or nonconducting, and exhibit a relatively high resistance, e.g., greater than about 10 megaOhms. The selection device may remain in the off state until a sufficient voltage, e.g., $V_{TH}$, is applied, or a sufficient current is applied, e.g., $I_{TH}$, that may switch the selection device to a conductive, relatively low resistance on state. After a voltage potential of greater than about $V_{TH}$ is applied across the selection device 36, the voltage potential across the selection device 36 may drop ("snapback") to a holding voltage potential, $V_H$. Snapback may refer to the voltage difference between $V_{TH}$ and $V_H$ of a select device.

In the on state, the voltage potential across selection device 36 may remain close to the holding voltage of $V_H$ as current passing through selection device 36 is increased. The selection device 36 may remain on until the current through the select device drops below a holding current, $I_H$. Below this value, the selection device 36 may turn off and return to a relatively high resistance, nonconductive off state until the $V_{TH}$ and $I_{TH}$ are exceeded again.

In some embodiments, only one selection device 36 may be used. In other embodiments, more than two selection devices may be used. A single selection device may have a $V_H$ about equal to its threshold voltage, $V_{TH}$, (a voltage difference less than the threshold voltage of the memory element) to avoid triggering a reset bit when the selection device 36 triggers from a threshold voltage to a lower holding voltage called the snapback voltage. An another example, the threshold current of the memory element 34 may be about equal to the threshold current of the selection device 36 even though its snapback voltage is greater than the memory element's reset bit threshold voltage.

Programming of the chalcogenide 22 to alter the state or phase of the material may be accomplished by applying voltage potentials to the lower electrode 12 and upper electrode 30, thereby generating a voltage potential across the select device and memory element. When the voltage potential is greater than the threshold voltages of selection device 36 and memory element 34, then an electrical current may flow through the chalcogenide 22 in response to the applied voltage potentials, and may result in heating of the chalcogenide 22.

This heating may alter the memory state or phase of the chalcogenide 22. Altering the phase or state of the chalcogenide 22 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state.

The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 11:
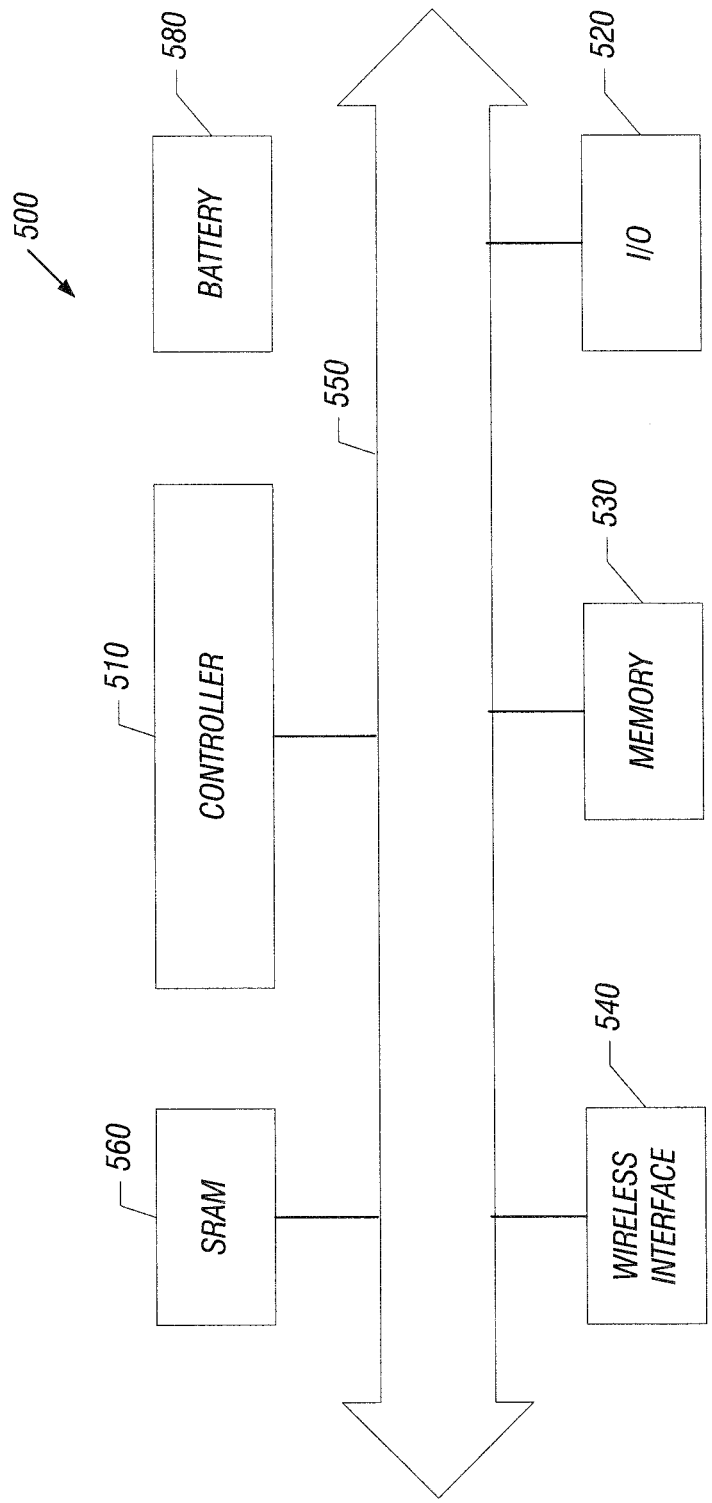
FIG. 11 is a schematic depiction of a system in accordance with one embodiment.

Turning to FIG. 11, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory—, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
   at least two spaced phase change memory elements;
   a continuous layer of chalcogenide extending between said elements; and
   an insulator, said phase change memory elements formed in a pore in said insulator.

2. The memory of claim 1 wherein said chalcogenide layer is part of an ovonic threshold switch.

3. The memory of claim 1 wherein said phase change memory elements include a chalcogenide material that changes phase.

4. The memory of claim 1 including a sidewall spacer in said pore.

5. The memory of claim 4 including a heater in said pore.

6. The memory of claim 5 wherein said memory element includes a chalcogenide material in contact with the continuous layer of chalcogenide.

7. The memory of claim 6 including an electrode on one side of said continuous layer of chalcogenide and said chalcogenide material of said memory element on the opposite side.

8. The memory of claim 7 including a diffusion barrier between said electrode and said continuous layer of chalcogenide.

9. The memory of claim 1 wherein said continuous layer of chalcogenide does not change phase.

10. A system comprising:
    a processor;
    a dynamic random access memory coupled to said processor;
    a memory coupled to said processor, said memory including at least two spaced phase change memory elements, a continuous layer of chalcogenide extending between said elements, and an insulator, said phase change memory elements formed in a pore in said insulator.

11. The system of claim 10 wherein said chalcogenide layer is part of an ovonic threshold switch.

12. The system of claim 11 wherein said chalcogenide layer does not change phase.

13. The system of claim 10 including a chalcogenide material that does change phase.

14. The system of claim 13 wherein said material and said layer are in contact.

* * * * *